United States Patent [19]

Havens

[11] 3,913,035

[45] Oct. 14, 1975

[54] NEGATIVE RESISTANCE HIGH-Q-MICROWAVE OSCILLATOR

[75] Inventor: Richard Calvin Havens, Scottsdale, Ariz.

[73] Assignee: Motorola, Inc., Chicago, Ill.

[22] Filed: July 1, 1974

[21] Appl. No.: 484,502

[52] U.S. Cl. .................... 331/107 R; 331/96

[51] Int. Cl.$^2$ .................... H03B 7/14

[58] Field of Search .................... 331/107, 101, 96

[56] References Cited

UNITED STATES PATENTS

| | | | |
|---|---|---|---|
| 3,510,800 | 5/1970 | Kaneko et al. | 331/96 |
| 3,534,293 | 10/1970 | Harkless | 331/96 |
| 3,626,327 | 12/1971 | Luchsinger | 331/96 |
| 3,639,856 | 2/1972 | Kimura et al. | 331/96 |
| 3,803,513 | 4/1974 | Oya et al. | 331/96 |
| 3,858,123 | 12/1974 | Ohta | 331/107 R |

*Primary Examiner*—John Kominski
*Attorney, Agent, or Firm*—Vincent J. Rauner; Michael D. Bingham

[57] ABSTRACT

A high-Q negative resistance microwave oscillator is disclosed which comprises a semiconductor diode, suitably a Gunn or Impatt diode, located within a low-Q resonant structure or cavity for generating a carrier frequency, *f;* and another waveguide cavity tuned to f having a very high-Q relative to the first cavity, and which is optimally coupled to the low-Q cavity. The microwave energy generated in the low-Q cavity is coupled to the high-Q cavity which reflects energy at frequency, *f,* back to the low-Q cavity to maintain oscillations at the aforementioned frequency. The microwave energy thus developed is supplied directly to a load by a microwave passage that is coupled to the low-Q cavity. An internal microwave load is employed to dissipate undesired frequencies thereby restricting these frequencies from being generated within the low-Q cavity and therefore enhancing the oscillator's frequency stability.

8 Claims, 2 Drawing Figures

NEGATIVE RESISTANCE HIGH-Q-MICROWAVE OSCILLATOR

BACKGROUND OF THE INVENTION

This invention relates to a solid state microwave cavity oscillator employing a negative resistance solid state device and, more particularly, to a frequency stable microwave cavity semiconductor diode oscillator for operation in the 16.0 gigahertz range.

Heretofore, semiconductor oscillators of various types have been made available for a variety of different applications. The design for and performance of such oscillators differ from one another depending upon the intended application. For instance, a microwave oscillator basically comprises a negative resistance semiconductor device connected through a resonator, tuned to the desired frequency, to a load having a positive resistance as "seen" by the device that is equal in magnitude to the negative resistance of the device.

The semiconductor diode oscillator incorporates as the active element, a diode, suitably a Gunn diode or an Impatt diode. The physical electronic theory of the operation of these diodes to convert a direct current (DC) bias voltage into electromagnetic energy being well known in the art is not here explained in detail. Briefly, in these oscillators, the semiconductor diode is located in a low-Q resonant structure or cavity which is tuned to the frequency at which a signal is desired, and a terminal is provided at which the DC bias source may be applied to the diode. The diode acts as a negative resistance which is greater than the loss resistance of the low-Q cavity and load and the circuit breaks into oscillations to generate electromagnetic energy. However, the diode requires that energy be fed back to the diode terminals in synchronism with current through the diode to maintain continuous oscillation generation. Unfortunately, even when design precautions are taken, frequencies other than the desired frequency may be applied across the diode, causing frequency in stability. To improve the frequency stability, other elements hereinafter discussed are added to the circuit.

Practical semiconductor diode oscillators presently found in communication systems incorporate at least one additional element to overcome the aforementioned difficulties. The basic structure which includes the diode and cavity is coupled to a stabilization cavity which in turn is connected to the load. The stabilization cavity is a second resonant cavity having a high-Q factor that is very large in comparison to the low-Q cavity in which the diode is located. The stabilization cavity includes an input coupling and output coupling. The input coupling is coupled to the output of the low-Q cavity and the output of the stabilization cavity is coupled to a load.

Unfortunately, present designs have a distinct disadvantage. In passing the microwave frequency energy from the low-Q oscillator cavity through the stabilization cavity to an output load an approximate 10 to 13 dB drop in output power typically results. In other words, in passing the microwave frequency through the stabilization cavity, the effective "Q" factor of the stabilization cavity is substantially decreased. Therefore, FM noise can be of greater magnitude than may be desired.

Thus, a need existed to develop the negative resistance microwave oscillator including a high-Q stabilization cavity for providing frequency stabilization and eliminating much of the noise of spurious AM and FM signals.

SUMMARY OF THE INVENTION

It is an object of this invention to provide a high-Q stabilized microwave oscillator.

It is another object of this invention to provide a microwave oscillator capable of delivering microwave power in the frequency range of 16 gigahertz.

It is still a further object of this invention to provide a microwave oscillator suitable for use as a master oscillator in an active radar receiver.

In accordance with the invention, a negative resistance device is positioned in a resonant structure or cavity. Direct current (DC) bias is applied to the device through a bias arrangement comprising a dissipative load material and a quarter wavelength choke such that energy developed at the predetermined frequency of oscillation is reflected back to the diode. To insure frequency stability, the oscillatory energy is coupled by way of a reduced height waveguide transmission line through an iris to a second waveguide cavity at a location appropriate for reflecting back sufficient energy such that oscillations are maintained at the precise operating frequency. As another feature of the invention, a second type of dissipative load material is disposed in the waveguide transmission line, beyond the second resonant waveguide cavity, such that frequencies, other than the predetermined frequency generated by the negative resistance device, are dissipated in a matched load. Therefore, by dissipating undesired energies at unwanted frequencies and reflecting back energy at the predetermined frequency from the second or high-Q resonant cavity to the first or low-Q resonant cavity, the negative resistance device is made to operate or "lock" at the desired frequency. The radio frequency (RF) power thus generated is propogated to a load through a second waveguide transmission line that is coupled to the low-Q resonant cavity.

These and other objects, features and advantages of the invention will be better understood from the consideration of the following description in connection with the accompanying drawings.

DETAILED DESCRIPTION OF THE PREFERRED EMBODIMENT

Figure 1:
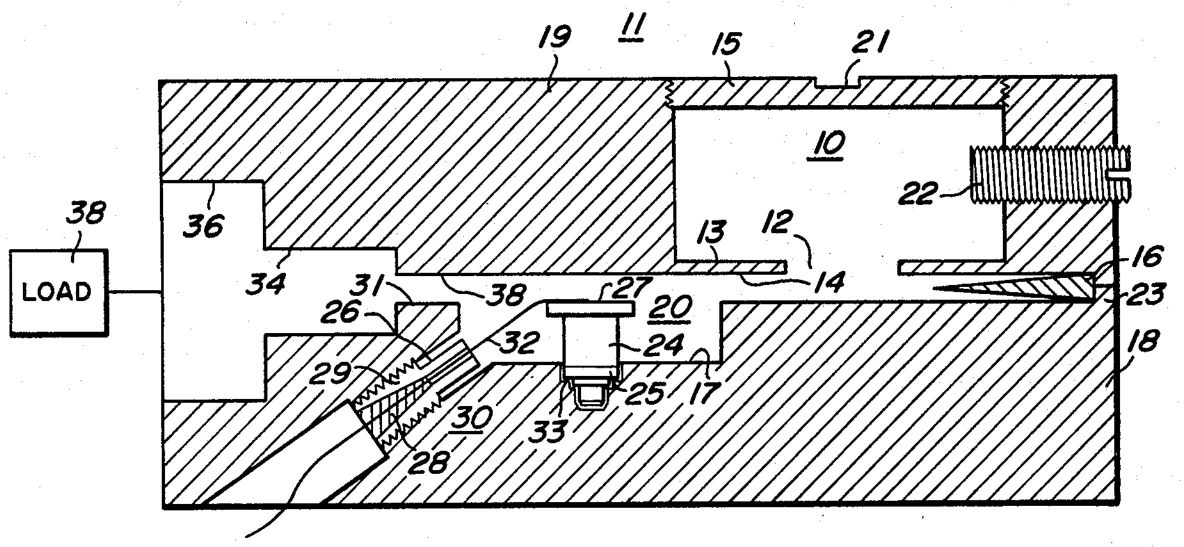
FIG. 1 is a cross sectional view through the microwave oscillator showing the details of construction in accordance with the present invention.

Referring to FIG. 1, there is shown a microwave oscillator 11 comprising a housing 23 containing a high-Q waveguide cavity 10, a waveguide 14, and an iris 12 coupling high-Q cavity 10 to waveguide 14, a dissipative impedance material 16 disposed in waveguide 14 beyond high-Q waveguide cavity 10, a low-Q cavity 20 also coupled to waveguide 14, a negative resistance RF diode 24 disposed in low-Q cavity 20, a second waveguide 38 coupled to low-Q cavity 20, and a quarter-wave transformer 34 coupled to waveguide 38.

For convenience in manufacturing, housing 23 may consist of two housing parts 18 and 19 being attached together. It is noted that the illustration of FIG. 1, for purposes of clearly illustrating the construction of the invention, does not include minor structural details such as nuts and bolts, welds, etc. and is of exaggerated proportions. Housing 18 may be formed of any good heat conducting metal which may be plated to achieve maximum electrical conductivity, copper, for example. Also, housing 19 may be formed of a low temperature coefficient metal such as Invar which enhances the microwave oscillator's frequency stability over temperature, as will be explained hereafter.

Cavity 10 is a cylindrical volume which may be formed by boring inwardly of housing part 19 terminating with surface 13 as one end wall. The other end wall may be formed from the surface of metallic plug 15 which is threaded into housing part 19, as shown. A slot 21, or the like, may be provided for a turning plug 15 into and out of housing 19. Circular iris 12 may be formed by boring through end wall 13 to complete cavity 10.

Cavity 20 is formed inwardly of the surface of housing part 18, as shown, and comprises a cylindrical cavity. Cavity 20 terminates with surface 17 of housing part 18.

By design of its dimensions, waveguide cavity 10 is a high-Q cavity resonant at a predetermined frequency, *f*. While not apparent in the illustration of FIG. 1, the physical size of cavity 10 is much larger than cavity 20. The dimensions of cavity 10 are chosen to provide a $TM_{010}$ circular waveguide mode cavity, with resonant frequency, *f*, being determined essentially by the diameter of cavity 10. The diameter is chosen, as is understood in the art, to be typically one-half wavelength electrically in dimension in the radial mode. For example, the circular $TM_{010}$ mode cavity has inner dimensions of 0.565 inch Dia. × 0.350 inch long.

Cavity 10, as previously mentioned, is constructed of Invar and may be plated to obtain the desired electrical conductivity characteristics. Invar has a low-temperature coefficient of expansion and therefore does not change in dimension, substantially, as a result of ambient temperature changes. Hence, as is also well-understood in the microwave art, cavity 10, being a high-Q cavity, is very selective as to its resonant frequency and is very stable.

Mechanical tuning of cavity 10 is achieved by the employment of a turning screw 22 used in a known manner to adjust the resonant frequency of cavity 10. By rotating turning screw 22 into or out of cavity 10, the resonant frequency is either increased or decreased, respectively, with respect to the predetermined frequency, *f*.

Negative resistance diode 24, which may be of the Gunn or Impatt varieties is disposed in cavity 20 and has its dimensions coordinated with those of cavity 20 for efficient generation and transfer of microwave power. Diode 24 is shown as having a metallic cover 27 and a metallic base 25. Metallic base 25 includes a prong as part of its structure. A diode mounting recepticle is fabricated into surface 17 of cavity 20 and receives metallic base 25, including the prong portion. Metallic base 25 may be soldered to surface 17 of cavity 20 for efficiently removing heat from diode 24 during its operation. Also, by mounting diode 24 into surface 17 of cavity 20, the parasitic reactances associated with the diode package are effectively reduced by decreasing the equivalent package inductance due to a coaxial transmission line of smaller characteristic impedance being formed between the diode structure and the mounting recepticle.

Since diode 24 is a commercial article, to this extent, cavity 20 has its dimensions chosen to accommodaate those of diode 24. The depth of cavity 20 may be such as to accommodate diode 24 so that metallic cover 27 is essentially in the same plane as surface 31. The diameter of cavity 20 is determined, in accordance with the parameters associated with diode 24 disposed therein, in order that cavity 20 including diode 24 and bias structure 30 have a resonant frequency at essentially the same frequency as cavity 10. In the particular case being described, the diameter of cavity 20 is 0.260 inch and the depth is 0.04 inch.

Cavity 20 being small, approximately 1/40th of the volume of cavity 10, and having the package diode 24 disposed therein, takes on some of the characteristics of a lump constant circuit. At least partially for this reason, cavity 20 has a broad frequency resonance characteristic of a low-Q cavity. Hence, cavity 20 will in effect resonate across a wide frequency range which includes the predetermined frequency, *f*.

Figure 2:
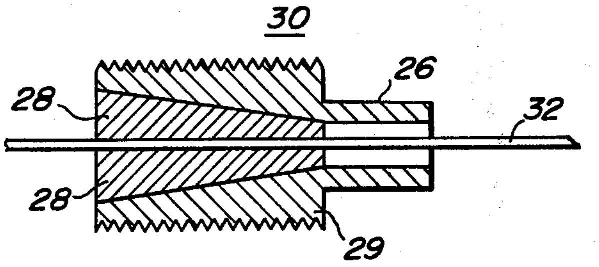
FIG. 2 is an enlarged cross sectional view of the direct current (DC) bias arrangement showing the detailed construction in accordance with the present invention.

DC bias is applied to diode 24 through center conducting wire 32 which is connected to one end of diode 24 and to a source of DC bias voltage. Wire 32 is brought through housing 18 into cavity 20 by bias structure 30. In FIG. 2, bias structure 30 is shown somewhat enlarged that includes metal sleeving 29 which encases dissipative load material 28 and wire 32. Bias structure 30 also comprises quarter-wave choke 26. The foregoing elements comprising cavity 20, diode 24 and DC bias structure 30 may be referred to as the "oscillator section" of the invention.

A microwave transmission line, waveguide 14, electromagnetically couples cavity 20 to cavity 10. Microwave energy generated in the oscillator section is transmitted in waveguide 14 into cavity 10 through coupling iris 12.

Ideally, waveguide 14 is made to be of such length that the effective electrical distance between iris 12 and the axis of diode 24 forms an effective length of transmission line that is an odd multiple of one-quarter wavelength at the predetermined frequency, *f*. An odd multiple of one-quarter wavelength is required in order that positive feedback is obtained by diode 24 to maintain oscillation at the natural resonant frequency of cavity 10. If even multiples of one-quarter wavelength are used the polarity of feedback is reversed which drives the oscillation frequency away from the natural resonant frequency of cavity 10.

A dissipative impedance material 16 is disposed in waveguide 14 beyond iris 12. The dimensions and shape of impedance material 16 are chosen to provide a broad band match to all frequencies that are generated in the oscillator section. Therefore, material 16 provides an excellent load for selected frequencies and does not reflect these frequencies back to either cavity 10 or cavity 20.

Another microwave transmission line comprising waveguide 38, having the same physical dimensions as waveguide 14, quarter wave transformer 34, and waveguide 36, is coupled to the oscillator section and receives the microwave energy generated by the oscillator section. A radio or microwave frequency load 38 is coupled in a conventional manner to receive the microwave energy transmitted in the aforementioned transmission line. Load 38, for example, may be other electronic stages in a communications or radar receiver.

In operation, a source of direct current bias is applied to diode 24 through bias structure 30. In a conventional and a well-known manner, diode 24 acts as a negative resistance and in combination with cavity 20 and the effective impedance of load 38 as seen by cavity 20 generates microwave oscillation energy or electromagnetic energy, as variously termed. The characteristics of resonant cavity 20 are such that it enhances the generation of microwave energy of the predetermined frequency $f$ to which cavity 20 is turned. Alternatively, cavity 20 can be viewed as converting the electromagnetic energy developed therein by diode 24 into a periodic frequency dependent upon the equivalent lumped inductance and capacitance of cavity 20. In the preferred embodiment, cavity 20 is resonant at the frequency of 16.0 of gigahertz.

Bias structure 30 is constructed in such a manner that a quarter wave choke 26, at frequency $f$ is developed as structure 30 is threaded into housing 18. It is noted that as structure 30 is threaded into housing 18, a microwave frequency short circuit is developed at the interface of surface 29 and choke 26. Therefore, as is well-known in the art, the short circuit is rotated by a quarter wavelength such that a microwave frequency open circuit is presented to energy at frequency $f$. The microwave energy that is generated by the oscillator section at frequency $f$ which appears at choke 26 is thereby reflected back through transmission line 32 to diode 24 in a regenerative fashion and enhances oscillation at frequency $f$. Other microwave energy that may be generated by the oscillator section at other frequencies and transmitted to bias structure 30 is dissipated in load material 28 which is made to have an equal impedance value to choke 26, in such a manner that very little energy at these frequencies is reflected back to diode 24. Hence, bias structure 30 enhances the generation of microwave energy at frequency $f$ and helps stabilize low-Q cavity 20 by dissipating microwave energy generated at undesired frequencies.

A portion of the microwave oscillation energy generated in the oscillator section is coupled to high-Q cavity 10, which may be referred to as a stabilization cavity through waveguide 14. The oscillation energy is coupled to high-Q cavity 10 through iris 12. Cavity 10 is appropriately located to be essentially a quarter wavelength electrically from the axis of iris 12 to the axis of diode 24 and is thereby optimally coupled to low-Q cavity 20.

Iris 12 is positioned at the center of the wide dimension of waveguide 14 and communicates to waveguide 14. Because of the placement of iris 12, cavity 10 is coupled in series with cavity 20 and presents a high impedance load to cavity 20 at frequency $f$ in order that a substantial amount of the microwave energy generated by the oscillator section at frequency $f$ is reflected back to cavity 20.

High-Q cavity 10, having a very sharp resonance response, reflects back energy of sufficient magnitude to substain oscillation in cavity 20 only at the predetermined frequency $f$. Hence, cavity 10 stabilizes and enhances the generation of microwave energy in the oscillator section at the predetermined frequency $f$.

A waveguide load 16 is disposed in waveguide 14 beyond high-Q cavity 10 and is comprised of a microwave energy dissipating material. Electrically, high-Q cavity 10 is connected in series between the oscillator section and waveguide dissipating material 16. Since cavity 10 appears as a short circuit to off-resonant frequencies, energy that is generated by the oscillator section at these frequencies is then dissipated in the waveguide load 16. Consequently, waveguide load 16 also helps to stabilize the oscillator section at the predetermined frequency and prevents oscillator 11 from moding.

Waveguide 38 receives the energy generated by the oscillator section and passes it to an appropriate microwave load 38 through matching transformer section 34 and waveguide 36.

Several advantages are attained by the embodiment of this invention over prior art microwave cavity oscillators. Better efficiency is achieved by the oscillator of the present design since the microwave oscillation energy generated by the oscillator section is not passed through the stabilization cavity to an output load. Hence, the quality factor of the stabilization cavity is not reduced and thereby causes more energy to be reflected back to the oscillator section which provides for more energy to be supplied to the oscillator load through the second or output transmission line. Also, better stability is achieved by restricting the generation of undesired frequencies with the aid of an internal matched load which dissipates the undesired frequencies.

The foregoing description is intended to be illustrative and various other embodiments and modifications may be made without departing from the spirit and scope of the invention.

I claim:

1. A negative resistance microwave oscillator comprising in combination:

a low-Q resonating means including a negative resistance device which is disposed into and within a cylindrical cavity for generating microwave energy in a range of predetermined frequencies;

bias means electrically connected to said negative resistance device for providing a direct current bias to said negative resistance device for providing a direct current bias to said negative resistance device of sufficient energy to generate said microwave energy;

a high-Q resonating means resonant at a predetermined frequency and electromagnetically connected in series with said low-Q resonating means for receiving said microwave energy from said low-Q resonating means and reflecting back a substantial portion of said microwave energy at said predetermined frequency to said low-Q resonating means to maintain microwave frequency oscillation at said predetermined frequency;

first dissipative means electromagnetically connected in series with said high-Q resonating means and said low-Q resonating means for receiving said microwave energy at frequencies other than said predetermined frequency and dissipating said microwave energy at the undesirable frequencies to enhance frequency stability of the microwave oscillator;

first microwave transmission means electromagnetically coupled to said low-Q resonating means for transmitting said microwave energy supplied directly thereto from said low-Q resonating means at said predetermined frequency to an oscillator load; and said bias means including transmission means electrically connected to said negative resistance device for applying direct current bias thereto, second dissipating means enclosing a first portion of said transmission means for dissipating microwave energy at undesired microwave frequencies, and coaxial transmission means enclosing a portion of said transmission means for directly reflecting back energy at said predetermined frequency to said negative resistance device.

2. The negative resistance microwave oscillator of claim 1 further includes:

second microwave transmission means for electromagnetically coupling said high-Q resonating means to said low-Q resonating means;

said high-Q resonating means being a cylindrical volume having a predetermined diameter of essentially one-half wavelength in electrical length at said predetermined frequency, and two end walls spaced at a predetermined lateral dimension;

a circular iris formed in one of said end walls and communicating with said second microwave transmission means; and said negative resistance device including a Gunn diode.

3. A negative resistance microwave oscillator comprising:

a high-Q cylindrical cavity resonant at a predetermined frequency, said high-Q cavity having a predetermined diameter of essentially one-half wavelength in electrical length at said predetermined frequency and two end walls;

a first microwave transmission means;

a low-Q resonant structure having a floor and a side wall extending from said floor, terminus of said side wall defining an opening communicating with said first microwave transmission means;

oscillating generating means disposed into said low-Q structure for providing microwave oscillation energy in a range of frequencies including said predetermined frequency;

bias means electrically connected to said oscillating generating means for applying direct current bias voltage to said oscillating generating means;

coupling means formed in one of said walls of said high-Q cavity and communicating with said first microwave transmission means;

first dissipating means disposed in said first microwave transmission means providing a matched load to said range of frequencies, said first dissipating means being spaced beyond said high-Q cavity and terminating at one end of said first microwave transmission means;

second microwave transmission means electromagnetically coupled to said low-Q structure for receiving said microwave energy at said predetermined frequency and transmitting said microwave energy to a load; and said high-Q cylindrical cavity reflecting a substantial portion of energy at said predetermined frequency to said low-Q resonant structure for enhancing the frequency stability of the oscillator.

4. The negative resistance microwave oscillator of claim 3 wherein said bias means includes in combination:

transmission means electrically connected to said oscillating generating means for applying direct current bias voltage to said oscillating generating means;

second dissipating means enclosing a first portion of said transmission means for dissipating microwave energy generated at undesired microwave frequencies; and a coaxial transmission means enclosing a second portion of said transmission means for reflecting back energy at said predetermined frequency to said oscillating generating means.

5. The negative resistance microwave oscillator of claim 3 wherein said oscillating generating means includes a Gunn diode.

6. The negative resistance microwave oscillator of claim 3 further including:

said low-Q structure having a volume smaller than said high-Q cavity by a factor such that in combination with said oscillating generating means, said bias means and said low-Q structure, the resonant frequency of said low-Q structure is essentially the same as that of said high-Q cavity; and said coupling means being a circular iris communicating with said first microwave means in such a manner as to cause said high-Q cavity to appear to be connected in series with said low-Q structure.

7. The negative resistance oscillator of claim 3 wherein said high-Q cavity further includes:

tuning means for changing the resonant frequency of said high-Q cavity to vary said predetermined frequency.

8. The negative resistance microwave oscillator of claim 3 further includes in combination:

bias means having said transmission means electrically connected to said oscillating generating means for applying direct current bias voltage to said oscillating generating means, a second dissipating means enclosing the first portion of said transmission means for dissipating microwave energy at undesired microwave frequencies, and a coaxial transmission means comprising a second portion of said transmission means for reflecting back energy at said predetermined frequency to said oscillating generating means;

said low-Q structure having a volume smaller than said high-Q cavity by a factor such that in combination with said oscillating generating means, said bias means and said low-Q structure the resonant frequency of said low-Q structure is essentially the same as that of high-Q cavity;

said coupling means being a circular iris communicating with said first microwave means in such a manner as to cause said high-Q cavity to appear to be series connected to said low-Q structure; and tuning means for changing the resonant frequency of said high-Q cavity to vary said predetermined frequency of the microwave oscillator.

* * * * *